United States Patent
Bouny

(10) Patent No.: US 7,586,374 B2
(45) Date of Patent: Sep. 8, 2009

(54) WIRELESS COMMUNICATION UNIT, INTEGRATED CIRCUIT AND BIASING THEREFOR

(75) Inventor: Jean-Jacques Bouny, Fontenilles (FR)

(73) Assignee: Freescale Semiconductor, Inc., Austin, TX (US)

( * ) Notice: Subject to any disclaimer, the term of this patent is extended or adjusted under 35 U.S.C. 154(b) by 69 days.

(21) Appl. No.: 11/994,258

(22) PCT Filed: Jun. 30, 2005

(86) PCT No.: PCT/EP2005/008197

§ 371 (c)(1),
(2), (4) Date: Dec. 28, 2007

(87) PCT Pub. No.: WO2007/003219

PCT Pub. Date: Jan. 11, 2007

(65) Prior Publication Data

US 2008/0204146 A1    Aug. 28, 2008

(51) Int. Cl.
*H03F 3/68* (2006.01)
*H03G 3/30* (2006.01)

(52) U.S. Cl. .................. 330/295; 330/136; 330/140

(58) Field of Classification Search ............ 330/136, 330/140, 285, 295
See application file for complete search history.

(56) References Cited

U.S. PATENT DOCUMENTS

| 5,757,229 A * | 5/1998 | Mitzlaff .............. 330/124 R |
| 6,731,173 B1 | 5/2004 | Thompson |
| 2004/0174212 A1 | 9/2004 | Kim et al. |

FOREIGN PATENT DOCUMENTS

EP    0982847 A    3/2000

OTHER PUBLICATIONS

Yang: "A microwave doherty amplifier employing envelope tracking technique for high efficiency and linearty"; IEEE Microwave and Wireless Components Letters, vol. 13, No. 9, Sep. 2003.

* cited by examiner

*Primary Examiner*—Steven J Mottola

(57) ABSTRACT

A wireless communication unit comprises a semiconductor power amplifier device and a bias control circuit therefor. The bias control circuit comprises a detector for detecting at least a portion of the RF input signal; and a buffer for buffering the detected RF input signal. The detector is arranged to provide at least one inverted signal of the RF input signal. A semiconductor amplifier device is connected to an output of the bias control circuit and arranged to use an inverted detected signal to extract current from the output. When applied to a Doherty amplifier design, the biasing circuit requires fewer components, for example no video (buffer) amplifier and no delay block are required in the RF path. This facilitates integration of the circuit on a semiconductor die.

22 Claims, 5 Drawing Sheets

FIG. 1 – Prior art

WIRELESS COMMUNICATION UNIT, INTEGRATED CIRCUIT AND BIASING THEREFOR

FIELD OF THE INVENTION

The preferred embodiment of the present invention relates to radio frequency (RF) and microwave power amplifiers, suitable for telecommunication applications. The invention is applicable to, but not limited to, a biasing circuit for a linear Doherty power amplifier.

BACKGROUND OF THE INVENTION

A primary focus of the present invention is the field of radio frequency (RF) and microwave power amplifiers capable of use in telecommunication applications. Continuing pressure on the limited spectrum available for radio communication systems is forcing the development of spectrally-efficient linear modulation schemes. Since the envelopes of a number of these linear modulation schemes fluctuate, intermodulation products can be generated in the non-linear power amplifier. This results in the average power being delivered to the antenna being significantly lower than the maximum power, leading to poor efficiency of the power amplifier. Specifically, in this field, there has been a significant amount of research effort in developing high efficiency topologies capable of providing high performances in the 'back-off' (linear) region of the power amplifier.

Linear modulation schemes require linear amplification of the modulated signal in order to minimise undesired out-of-band emissions. Quantum processes within a typical RF amplifying device are inherently non-linear by nature. Only when a small portion of the consumed DC power is transformed into RF power, can the transfer function of the amplifying device be approximated by a straight line, i.e. as in an ideal linear amplifier case. This mode of operation provides a low efficiency of DC to RF power conversion, which is unacceptable for portable (subscriber) wireless communication units. Furthermore, the low efficiency is also recognised as being problematic for the base stations.

Furthermore, the emphasis in portable (subscriber) equipment is to increase battery life. The emphasis for base station designers is to reduce operating and equipment cost (power consumption, size, power dissipation, etc.). Hence, such operating efficiencies of the amplifiers used must be maximised. To achieve both linearity and efficiency, so called linearisation techniques are used to improve the linearity of the more efficient amplifier classes, for example class 'AB', 'B' or 'C' amplifiers. A number of linearising techniques exist, which are often used in designing linear transmitters, such as Cartesian Feedback, Feed-forward, and Adaptive Pre-distortion.

A further technique, which is a focus of the present invention, is a 'Doherty' amplifier. The concept behind a Doherty amplifier is to increase the efficiency of a power amplifier in the so-called 'back-off' region, and was described in the 1930's by Mr Doherty. A way to improve further a 'Doherty' amplifier (with regard to efficiency/linearity trade-off) is described in a paper authored by Youngoo Yang, and titled "A microwave Doherty amplifier employing envelope tracking technique for high efficiency and linearity", IEEE Microwave and Wireless Components Letters, Vol. 13, n° 9, September 2003.

A problem with the existing Doherty technique with envelope tracking (or gate bias modulation) is that it inherently requires a delay block at the input of the radio frequency (RF) power amplifier (PA) in all 'practical'. Such a delay function is very difficult to integrate on an integrated circuit (IC). Furthermore, the delay function often requires tuning implemented as a microstrip line, due to mismatch effects creating efficiency problems at radio frequencies.

Referring now to FIG. 1, a known Doherty Amplifier topology 100 is illustrated. The Doherty Amplifier topology 100 employs a modulated or envelope tracking bias technique, as described in the aforementioned paper authored by Youngoo Yang. An RF input signal 105 is input to a directional coupler 110 and thereafter fed to two distinct amplification paths via a delay line 115. The two amplification paths are substantially 'matched', to facilitate their combined non-linear outputs producing a linear RF output signal 195. The two amplification paths comprise RF transmission paths 125, 130 that feed into input pre-matching circuits 145. The two (input) paths are coupled via resistor 135. One amplification path is provided with a carrier bias 150, input to a gate of a first high-power transistor 180. The second amplification path incorporates a $\lambda/4$ transmission path (equivalent to a 90 degree phase shift) and is provided with a peaking bias 160 (as described in greater detail below), input to a gate of a second high-power transistor 182.

The two RF power transistors 180, 182 are input to two respective output matching circuits 185 and combined together via a further transmission line 188. The design of the Doherty amplifier is such that the combined output from the two respective amplification paths, which comprise non-linear transistors, are substantially complementary in producing a linear output signal, i.e. the respective delay lines and respective bias signals applied to the transistors are configured to produce a (combined) linear RF output signal 195.

In order to modulate 160 the bias level of the peaking amplifier 182, a portion of the RF input signal 105 is extracted by the coupler 110 and is detected by RF detector 175. The portion of the RF input signal 105 is then buffered 170, and applied to the gate (or base in a bipolar transistor arrangement) of the transistor/peaking amplifier 182, via RF choke 165.

Referring now to FIG. 2, a known circuit 200 for implementing the bias control of the peaking amplifier (say transistor 182 of FIG. 1) is illustrated. Here, the portion of RF input signal 205 is input to a gate and drain port of a field effect transistor (FET) (T1) 210 via a series capacitance. The gate reference voltage is applied via resistor 215. An output matching circuit comprises 'R1' 220 and 'C1' 225, to couple the emitter port of T1 to a gate port of a second transistor (T2) 235, used as a buffer (emitter-follower). The drain port of T2 235 is provided by Vdd 230 and the emitter port provides an output peaking bias voltage 245, grounded via resistor 240.

Referring back to FIG. 1, the role of the buffer amplifier (often implemented as a video amplifier) 170 is to adjust the level of the detected RF input signal and to deliver sufficient current to the RF output/load 195. In this manner, the buffered (video) signal (as illustrated by waveform 265 in FIG. 2) follows, to some degree, the envelope of the RF input signal 105, 205 (as illustrated by waveform 255 in FIG. 2) without a delay. The load 195, as seen by the buffer 170, comprises the RF power transistor 182 and the surrounding RF components. This load is essentially capacitive.

In order to follow the video signal, the buffer 170 needs to be able to charge and discharge a capacitor at a high speed (up to 20 MHz for a $3^{rd}$ generation (3G) telecommunication product). A common way to implement the buffer 170 is to use a high-speed commercial video amplifier.

Due to the inherent delay in the video path, it is necessary to add a delay 115 in the RF path, so that the RF signal envelope and the modulated bias control signal are correctly aligned. As would be appreciated by a skilled artisan, the integration of a delay line (or a delay filter) 115 at the input of a high power amplifier 182 is complex. This is a major limitation in the use of such a Doherty amplifier technique in high-volume production.

Thus, a need exists for a wireless communication unit and a power amplifier circuit to drive a low impedance capacitive load, at high speed with minimum delay, which is suitable for implementation in a Doherty amplifier design.

STATEMENT OF INVENTION

In accordance with aspects of the present invention, there is provided a wireless communication unit and a radio frequency power amplifier integrated circuit, as defined in the appended Claims.

Figure 3:
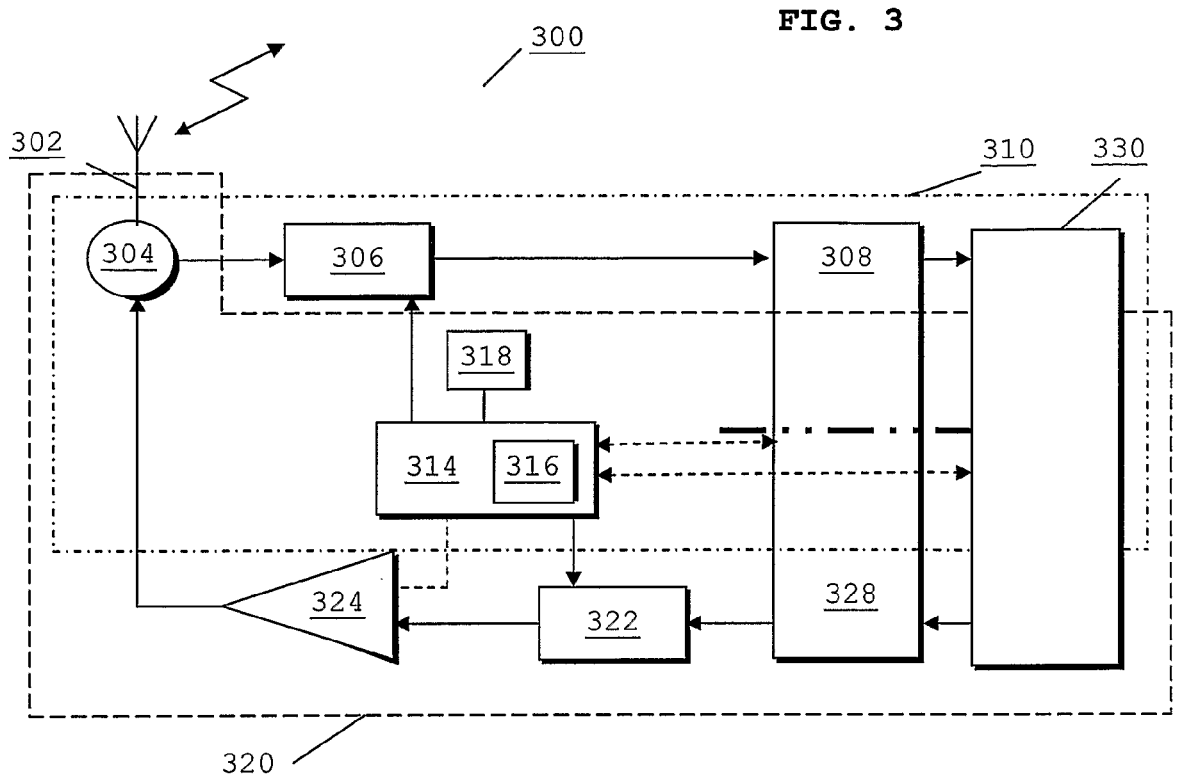
Figure 4:
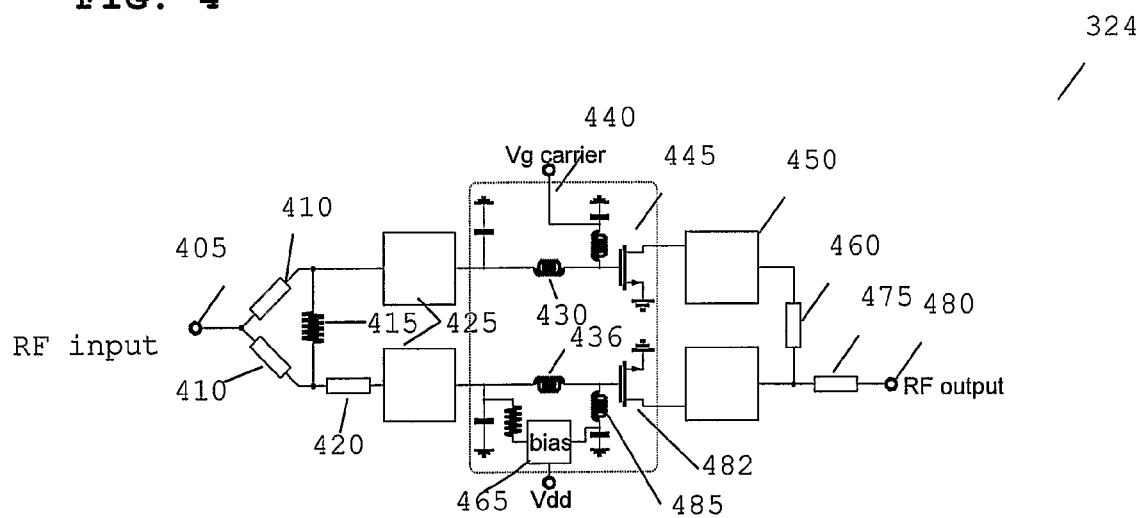
Figure 5:
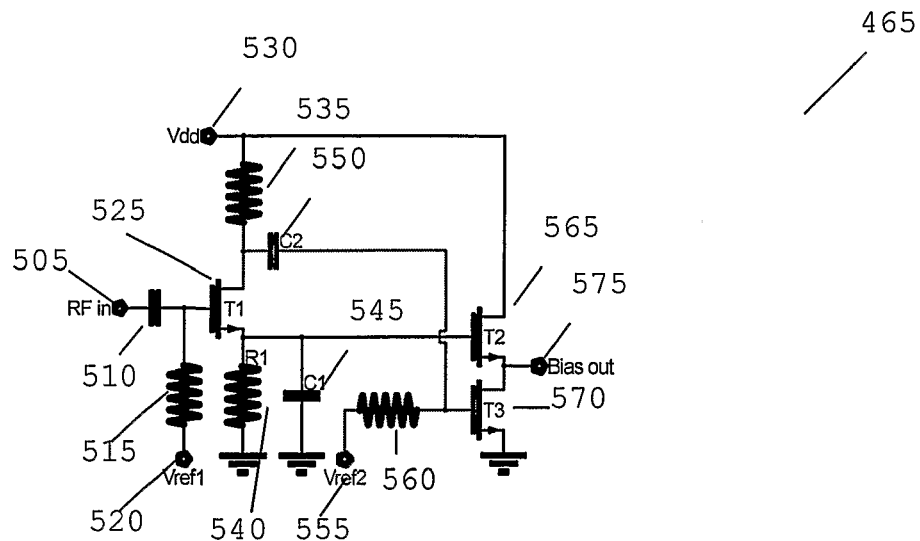
Figure 7:
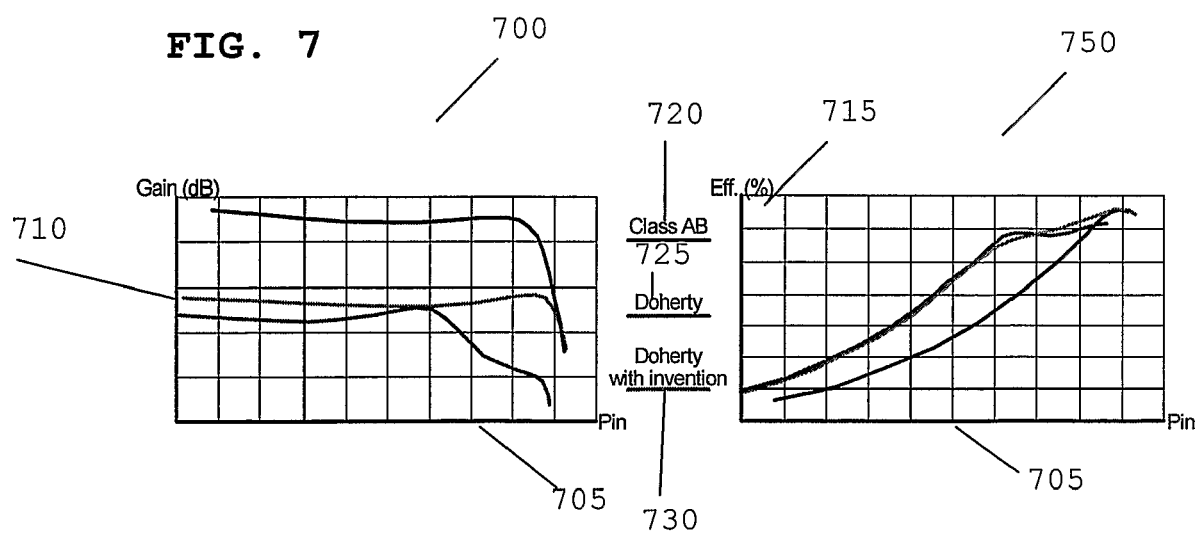
Figure 6:
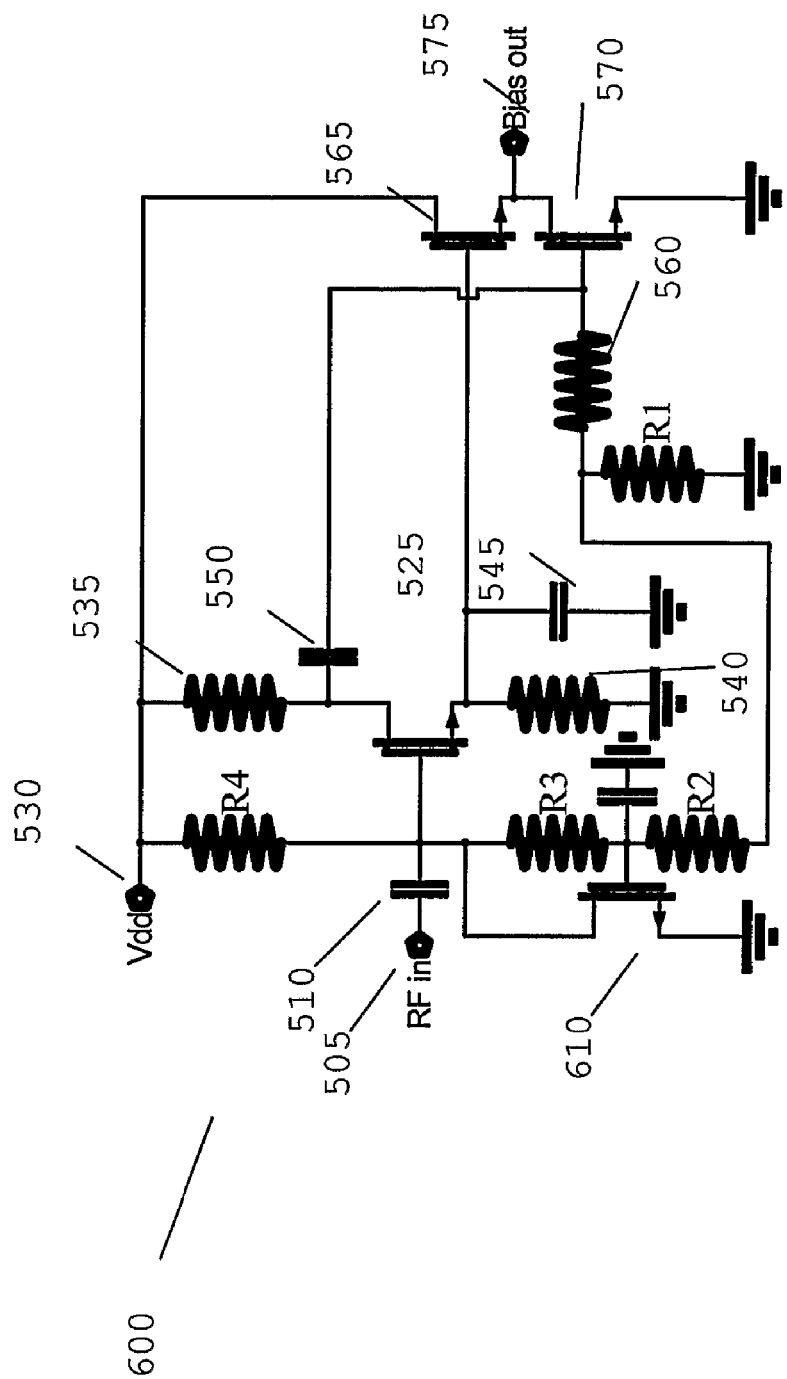

Exemplary embodiments of the present invention will now be described, by way of example only, with reference to the accompanying drawings, in which:

FIG. 3 illustrates a wireless communication unit, adapted in accordance with the preferred embodiment of the present invention;

FIG. 4 illustrates a Doherty amplifier adapted in accordance with the preferred embodiment of the present invention;

FIG. 5 illustrates a bias control circuit for use with the Doherty amplifier adapted in accordance with the preferred embodiment of the present invention;

FIG. 6 illustrates a bias control circuit including reference voltage elements for use with the Doherty amplifier and adapted in accordance with the preferred embodiment of the present invention; and FIG. 7 illustrates gain and efficiency curve highlighting the advantage of using such a bias control circuit, in accordance with the preferred embodiment of the present invention.

DESCRIPTION OF PREFERRED EMBODIMENTS

The preferred embodiment of the present invention will be described in terms of a wireless communication unit capable of operation in accordance with the well known 3G standard, as defined by the third generation partnership project (3GPP). However, it will be appreciated by a skilled artisan that the inventive concept herein described may be embodied in any type of radio frequency amplifier arrangement where improving the linearity and efficiency of the power amplifier stage is important.

Furthermore, it is envisaged that the inventive concept is not limited to use in Doherty amplifiers. It is envisaged that the inventive concept herein described may equally be applied to any application where a fast and powerful video amplifier is needed.

Referring now to FIG. 3, there is shown a block diagram of a wireless communication unit 300, adapted to support the inventive concept of the preferred embodiments of the present invention. For example, the wireless communication unit 300 comprises an antenna 302, preferably coupled to a duplex filter or antenna switch 304 that provides isolation between a receiver chain and a transmitter chain within the wireless communication unit 300. As also known in the art, the receiver chain typically includes a receiver front-end circuit 306 (effectively providing reception, filtering and intermediate or base-band frequency conversion). The receiver front-end circuit is serially coupled to a signal processing function 308, typically implemented as a digital signal processor (DSP). An output from the signal processing function 308 is provided to a suitable user interface 330, which preferably comprises an output device 310, such as a speaker and/or display, and an input device such as a microphone and/or keypad.

The user interface 330 is operably coupled to a memory unit 316, and a timer 318 via a controller 314. The controller 314 is also coupled to the receiver front-end circuit 306 and the signal processing function 308. The controller 314 may therefore receive bit error rate (BER) or frame error rate (FER) data from recovered information. The controller 314 is coupled to the memory device 316 for storing operating regimes, such as decoding/encoding functions and the like. A timer 318 is typically coupled to the controller 314 to control the timing of operations (transmission or reception of time-dependent signals) within the wireless communication unit 300.

As regards the transmit chain, the input device is coupled to a transmitter/modulation circuit 322 via the signal processing function 308 (or 328 if the transmit and receive portions were distinctly implemented). Thereafter, the transmit signal is passed through a power amplifier 324 to be radiated from the antenna 302. The transmitter/modulation circuit 322 and the power amplifier 324 are operationally responsive to the controller, with an output from the power amplifier coupled to the duplex filter or antenna switch 304. The transmitter/modulation circuitry 322 and receiver front-end circuitry 306 comprise frequency up-conversion and frequency down-conversion functions (not shown).

In summary, in accordance with the preferred embodiment of the present invention, the Power amplifier circuit 324 has been adapted to provide a simple and efficient mechanism to apply a modulated bias control circuit (in the form of envelope tracking) to bias an RF amplifier. The inventive concept is particularly beneficial when modulation is applied to a peaking amplifier of a Doherty amplifier in order to improve the efficiency and linearity thereof. The adaptation of the Power amplifier circuit 324 is further described below with respect to FIGS. 4 to 6.

It will be appreciated that the various components and circuits within the wireless communication unit 300 can be arranged in any suitable functional topology in order to utilise the inventive concept of the present invention. Furthermore, the various components within the wireless communication unit 300 can be realised in discrete or integrated component form, with an ultimate structure therefore being merely an application-specific selection.

Figure 1:
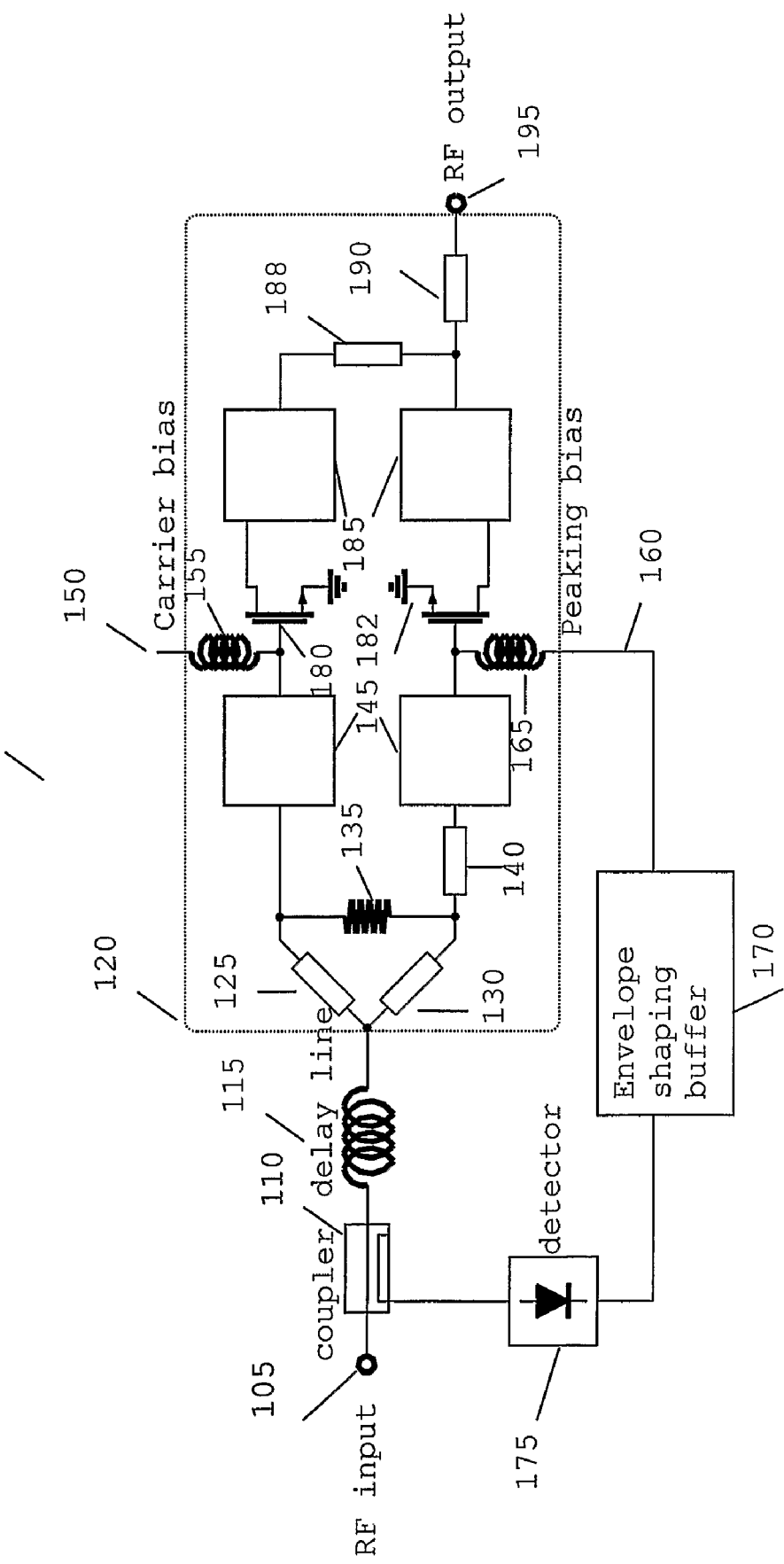
FIG. 1 illustrates a known RF/microwave Doherty Amplifier employing envelope tracking technique for high efficiency and linearity.

Referring now to FIG. 4, the adapted Power amplifier circuit 324 of FIG. 3 is shown in greater detail. The Doherty amplifier comprises a number of known elements, as would be appreciated by a skilled artisan when considering the prior art circuit of FIG. 1. For simplicity, such standard elements will not be described further.

Notably, in the preferred circuit of FIG. 4, there is no longer a need for:

(i) A direction coupler to sample a portion of the RF input signal;

(ii) A delay line in the RF path; or (iii) A specialised RF detector detecting a coupled level of the RF input signal 405.

The RF input signal 405 is obtained direct from the pre-matching circuit through a resistor (which is far easier to integrate than a directional coupler) and input direct to a bias control circuit 465, the preferred topography of which is further described with regard to FIG. 5 and FIG. 6. In addition, the envelope-shaping buffer has been replaced by circuit elements located within the bias control circuit 465.

The output of the bias control circuit 465 provides a bias voltage to the peaking amplifier transistor 482 via an RF choke 485. Thus, the preferred embodiment of the present invention utilises a RF Doherty amplifier where the bias level of the peaking amplifier is modulated in such a way that the bias level is maintained at a level well below the threshold voltage at low power (i.e. the voltage at which the transistor starts to conduct). In this manner, the 'carrier amplifier' is able to operate at maximum efficiency. Furthermore, the bias level is increased up to a nominal class AB bias, at a nominal RF output power, to allow the peaking amplifier to recover its nominal gain.

The modulated bias control circuit is operably coupled to:
(i) The pre-matching circuit 415 of the RF transistor with a resistor to sample the RF input signal, and
(ii) The output of the bias control circuit 465 is connected to a 'cold point' (i.e. a point where only DC is present) in the matching network.

A more detailed diagram of the bias control circuit 465 is illustrated in FIG. 5. Here, the RF input signal 505 is input to the gate of FET (T1) 580 (or base of an equivalent bipolar transistor) via coupling capacitor 510. Notably, the FET transistor (T1) 580 is arranged to function as the detector. The gate port of the FET (T1) 580 is supplied by a first voltage reference (Vref1) 520 via resistor 515. As known in the prior art bias circuit, the emitter port of transistor (T1) 580 is connected to an R-C matching network (R1, C1) 540, 545 and to the gate port of a second FET (T2) 565. In this manner, the detected envelope is available on the emitter (or source) port through the parallel R-C network.

In particular, the drain port of the second FET (T2) 565 is supplied by Vdd 530. Notably, the second FET (T2) 565 is arranged to operate as a buffer. Thus, in this manner, an inverted detected envelope signal is made available on the drain port of the FET (T1) 580 (or a comparable collector port of an equivalent bipolar transistor).

Notably, in accordance with the preferred embodiment of the present invention, the drain of the first FET (T1) 580 is supplied with Vdd 530 via resistor 535. A drain port of a third FET (T3) 570 is coupled to the emitter port of the second FET (T2) 565 to provide the bias output signal 575. In this manner, the third FET (T3) 570 is located in a parallel arrangement to the second FET (T2). The third transistor (T3) 570 is effectively added in parallel to the bias load output to extract the current when the envelope signal decreases. In particular, extraction of the current from the load is very important as, when the load is capacitive, it is easy to charge the capacitor quickly by reducing the output resistance of the buffer. However, when the envelope decreases, the buffer no longer delivers current and behaves as an open circuit. In this instant, the capacitor can only discharge through the resistance in parallel with the load, thereby providing a slow decrease in voltage, as shown in FIG. 2.

Notably, the bias point of the third (additional) transistor (T3) 570 is tuned so that it is "off" when no signal is applied. Furthermore, it is turned "on" when the envelope signal decreases through a capacitive connection (C2) 550, between the gate port of the third FET (T3) 570 and the drain port of the first FET (T1) 580. The signal on the drain port of the first FET is inverted compared to the envelope signal. Thus, when the signal goes down, the drain of T1 increases, thereby increasing the gate voltage of T3, which is turned 'on'. When the signal stops decreasing, the voltage on the gate of T3 returns to its initial value and is turned 'off'. The gate port of the third FET (T3) 570 is provided with a bias voltage from reference voltage (Vref2) 555, via resistor 560. Vref2 is chosen so that T3 is turned 'off' when no envelope signal is applied, for example it is selected to be lower than the threshold voltage of the FET).

Figure 2:
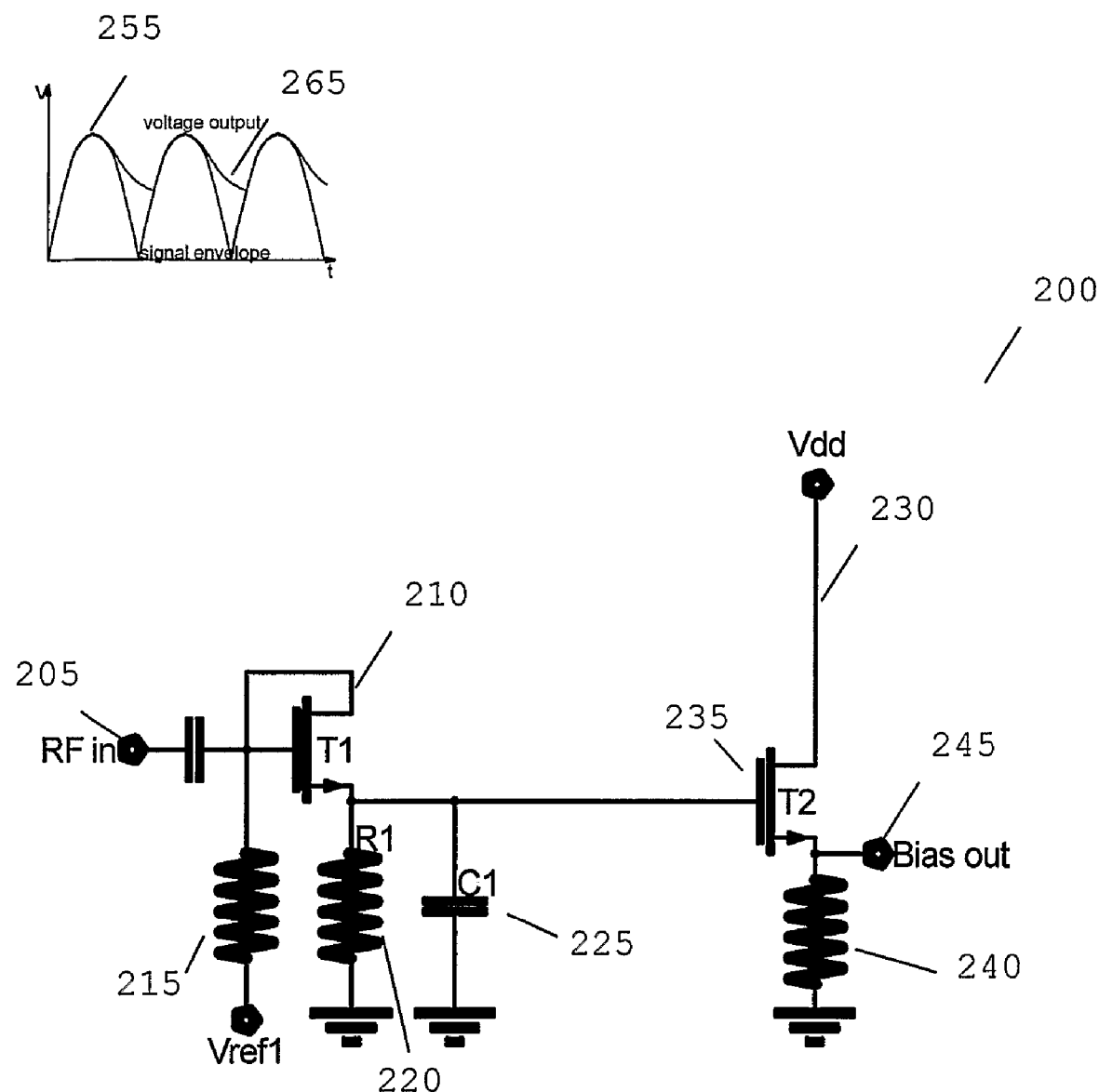
FIG. 2 illustrates a known peaking bias circuit for a Doherty amplifier, together with a waveform indication of how the bias voltage tracks the signal envelope.

Thus, a skilled artisan will appreciate that the buffer of the prior art circuit in FIG. 2 has been replaced by a source follower stage with sufficient size to be able to deliver the required current to the load/bias output port 575 (i.e. the bigger the transistor, the higher its current capability).

Preferably, the three FETs in FIG. 5 use the same type of transistor, as the RF power transistor (say, transistor 482 of FIG. 4) to be biased. In this manner, the circuit provides a self-compensated design with respect to the bias point tuning, providing the voltage references are also based on a similar transistor (see FIG. 6). Any change in the threshold voltage of the FETs (temperature change, process variations, etc.) will be taken into account by the reference, and advantageously no tuning is therefore necessary.

Furthermore, as the preferred embodiment uses only one type of active device, it is very simple to integrate on a single die with the primary RF power transistor.

Advantageously, the bias control circuit 465 of FIG. 5 provides a modulated gate bias circuit for RF power transistors whereby the bias voltage follows the RF signal envelope (i.e. the circuit supports envelope tracking).

Notably, instead of using a complex video amplifier (as illustrated in FIG. 2) that requires an RF delay in the main RF path, to provide compensation for delays in the RF amplifier bias control path, the inventive concept uses a transistor-based detector (T1) 580 providing at least one and preferably at least one and preferably two inverted RF input signals, a simple source follower buffer via second transistor (T2), and an additional transistor (T3) 570 located in parallel to the load (and second transistor (T2)) to extract current from the load when the envelope decreases.

The additional transistor (T3) 570 uses an inverted detected signal provided by the first transistor (T1) 580. This topology facilitates a total delay in the video path of below 1 nsec, which advantageously enables the delay block (delay 115 of FIG. 1) in the RF path of a Doherty amplifier to be removed.

With such a topology (i.e. a transistor detector (T1)) providing at least one inverted signal, a source follower buffer (T2), an additional third transistor (T3) located in parallel with the load), the circuit functions as a regular buffered detector when the envelope signal is at a low frequency, and performs a current extraction operation when the envelope frequency increases.

It is noteworthy that new telecommunications systems are using wider channels or higher modulation frequencies (for example 5 MHz per channel in a third generation partnership project (3GPP) system) and that most of the time a single amplifier has to amplify several channels. This further increases the modulation frequency (i.e. four 3GPP channels means at least 20 MHz of modulation frequency). This frequency aspect is even more important with the introduction of new linearization techniques, such as adaptive pre-distortion, as the signal entering in the power amplifier contains distortions that have to be amplified in order to cancel, at the output, the distortion generated by the amplifier. This additional distortion results in problematic spectral spreading, which further increases the modulation frequency at the input of the power amplifier.

Advantageously, the current consumption remains low. Furthermore, a skilled artisan will appreciate that the proposed new topology is very easy to integrate using only one 'type' of active device (i.e. only using LDMOS, or only using Bipolar transistor, or only using one type of FET, thereby simplifying the process and reducing the cost). Furthermore, this topology can be implemented using the same type of device as the RF power amplifier transistor to be biased. In this case, the bias level that is generated is effectively self-compensating, taking into account any device variations.

Referring now to FIG. 6, a more complete embodiment of the present invention is illustrated, where elements to generate the reference voltages are included. In FIG. 6, the reference voltage is supplied using a yet further (fourth) small-signal transistor device 610, with a few additional resistive elements. Notably, all active devices are identical (in a scaled down version) to the RF power transistor, in order to provide a bias signal to the RF power transistor that facilitates a self-compensating design. Reference transistor 610 is biased in the linear region through the resistor network R1 to R4. Then, the gate voltage (e.g. the initial reference voltage), is multiplied by the resistor ratio (R3)/(R2+R1). This is applied to the detector transistor 525, and is divided by the resistor ratio (R2)/(R1), which is applied to the current extraction transistor 570.

Referring now to FIG. 7, a first graph 700 illustrates the gain 710 versus the input power (Pin) 705, for a typical Class AB power amplifier 720, a typical Doherty amplifier 725 and a Doherty amplifier employing the aforementioned inventive concept 730. As can be clearly appreciated by a skilled artisan, there is a significant gain advantage when comparing the performance of a typical Doherty amplifier 725 and a Doherty amplifier employing the aforementioned inventive concept 730.

Furthermore, as illustrated in the second graph 750, which shows power amplifier efficiency 715 versus input power (Pin) 705, there is negligible variation in power amplifier efficiency when comparing the performance of a typical Doherty amplifier 725 and a Doherty amplifier employing the aforementioned inventive concept 730. Thus, power amplifier efficiency is maintained with an improvement in gain and linearity, and a slight increase in output power.

A skilled artisan will appreciate that alternative circuit configurations to the circuits illustrated in FIG. 4, FIG. 5 and FIG. 6 may be employed that utilise the inventive concept of the present invention, without necessarily utilising the same connections or topographies between circuit elements. Consequently, it is envisaged that alternative topologies may be used that incorporate a detector that provides at least one inverted signal and one non-inverted signal, a buffer, such as a source follower buffer (T2), a (third) semiconductor amplifier device located in parallel with the load, whereby the bias control circuit functions as a regular simple buffered detector when the envelope signal is at a low frequency, and performs a current extraction operation (from the bias load) when the envelope frequency increases.

It will be understood that the improved wireless communication unit and power amplifier integrated bias control circuit, therefore, capable of driving a low impedance capacitive load at high speed with minimum delay, as described above, aims to provide at least one or more of the following advantages:

(i) The inventive concept requires fewer components than known circuits. In particular, no video amplifier and no delay block are required in the RF path of a Doherty amplifier implementation. This makes the implementation much more straightforward.

(ii) The inventive concept may be integrated in an RF transistor die, thereby making the power amplifier bias control circuit more robust to process variations.

(iii) The inventive concept improves system manufacturability.

(iv) The inventive concept provides an enabler for envelope tracking systems (such as a Doherty linear amplifier).

(v) The inventive concept can be implemented in a reduced size, cost and complexity of the complete power amplifier design.

(vi) The inventive concept is less sensitive to process variations (manufacturability).

In particular, it is envisaged that the aforementioned inventive concept can be applied by a semiconductor manufacturer to any power amplifier circuit that employs envelope tracking. It is further envisaged that, for example, a semiconductor manufacturer may employ the inventive concept in a design of a stand-alone power amplifier device and associated bias control circuit, and/or an application-specific integrated circuit (ASIC) and/or any other sub-system element capable of use in a radio frequency wireless communication unit.

Whilst the specific and preferred implementations of the embodiments of the present invention are described above, it is clear that one skilled in the art could readily apply variations and modifications of such inventive concepts.

Thus, an improved wireless communication unit and power amplifier integrated circuit have been described, wherein the aforementioned disadvantages with prior art arrangements have been substantially alleviated.

The invention claimed is:

1. A wireless communication unit comprising:
a semiconductor power amplifier device for receiving a radio frequency (RF) input signal; and
a bias control circuit arranged to provide a bias voltage to the semiconductor power amplifier device that follows an envelope of the RF input signal, wherein the bias control circuit comprises:
a detector for detecting at least a portion of the RF input signal; and
a buffer for buffering the detected RF input signal;
wherein the detector is arranged to provide at least one inverted signal and one non-inverted signal of the RF input signal; and
wherein the bias control circuit comprises a third semiconductor amplifier device connected to an output of the bias control circuit and arranged to use an inverted detected signal to extract current from the output.

2. A wireless communication unit according to claim 1 wherein at least one inverted signal provided by the detector tracks envelope variations of the RF input signal.

3. A wireless communication unit according to claim 1 wherein the detector is a first semiconductor amplifier device that provides the at least one inverted signal to a gate port of the third semiconductor amplifier device.

4. A wireless communication unit according to any claim 1, wherein the buffer is a second semiconductor amplifier device arranged to operate as a source or emitter follower.

5. A wireless communication unit according to claim 4 wherein the second semiconductor amplifier device is coupled serially to the third semiconductor amplifier device and arranged to provide a bias control signal to drive a low impedance capacitive load.

6. A wireless communication unit according to any claim 4, wherein the third semiconductor amplifier device is coupled in parallel to a load attached to the bias control circuit output.

7. A wireless communication unit according to claim 1, wherein a bias point of the third semiconductor amplifier device is tuned so that it is "off" when no RF input signal is applied.

8. A wireless communication unit according to claim 1, wherein a capacitive connection couples the third semiconductor amplifier device and the first semiconductor amplifier device such that a bias point of the third semiconductor amplifier device is tuned "on" when the RF input signal decreases.

9. A wireless communication unit according to any claim 1, wherein the first, second and third semiconductor amplifier devices are transistors that are of the same type as the semiconductor power amplifier device such that they are embedded in the same die.

10. A wireless communication unit according to claim 1, wherein the semiconductor power amplifier device is configured within a Doherty amplifier.

11. A wireless communication unit according to claim 10 wherein the semiconductor power amplifier device biased by the bias control circuit functions as a peaking amplifier within the Doherty amplifier.

12. A radio frequency power amplifier integrated circuit comprising:
a semiconductor power amplifier device for receiving a radio frequency (RF) input signal; and
a bias control circuit arranged to provide a bias voltage to the semiconductor power amplifier device that follows an envelope of the RF input signal, wherein the bias control circuit comprises:
a detector for detecting at least a portion of the RF input signal; and
a buffer for buffering the detected RF input signal;
wherein the detector is arranged to provide at least one inverted signal and one non-inverted signal of the RF input signal; and
wherein the bias control circuit comprises a third semiconductor amplifier device connected to an output of the bias control circuit (465) and arranged to use an inverted detected signal to extract current from the output.

13. A radio frequency power amplifier integrated circuit according to claim 12 wherein the at least one inverted signal provided by the detector tracks envelope variations of the RF input signal.

14. A radio frequency power amplifier integrated circuit according to claim 12 wherein the detector is a first semiconductor amplifier device that provides the at least one inverted signal to a gate port of the third semiconductor amplifier device.

15. A radio frequency power amplifier integrated circuit according to claim 12, wherein the buffer is a second semiconductor amplifier device arranged to operate as a source or emitter follower.

16. A radio frequency power amplifier integrated circuit according to claim 15 wherein the second semiconductor amplifier device is coupled serially to the third semiconductor amplifier device and arranged to provide a bias control signal to drive a low impedance capacitive load.

17. A wireless communication unit according to claim 12, wherein the third semiconductor amplifier device is coupled in parallel to a load attached to the bias control circuit output.

18. A radio frequency power amplifier integrated circuit according to claim 12, wherein a bias point of the third semiconductor amplifier device is tuned so that it is "off" when no RF input signal is applied.

19. A radio frequency power amplifier integrated circuit according to claim 12, wherein a capacitive connection couples the third semiconductor amplifier device and the first semiconductor amplifier device such that a bias point of the third semiconductor amplifier device is tuned "on" when the RF input signal decreases.

20. A radio frequency power amplifier integrated circuit according to claim 12, wherein the first, second and third semiconductor amplifier devices are transistors that are of the same type as the semiconductor power amplifier device such that they are embedded in the same die.

21. A radio frequency power amplifier integrated circuit according to claim 12, wherein the semiconductor power amplifier device is configured within a Doherty amplifier.

22. A radio frequency power amplifier integrated circuit according to claim 21 wherein the semiconductor power amplifier device biased by the bias control circuit functions as a peaking amplifier within the Doherty amplifier.

* * * * *